(12) United States Patent
Tsuyuno et al.

(10) Patent No.: US 12,506,133 B2
(45) Date of Patent: Dec. 23, 2025

(54) ELECTRIC CIRCUIT BODY, POWER CONVERSION DEVICE, AND METHOD FOR MANUFACTURING ELECTRIC CIRCUIT BODY

(71) Applicant: Hitachi Astemo, Ltd., Hitachinaka (JP)

(72) Inventors: Nobutake Tsuyuno, Tokyo (JP); Yusuke Takagi, Hitachinaka (JP); Yujiro Kaneko, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 607 days.

(21) Appl. No.: 17/910,201

(22) PCT Filed: Dec. 25, 2020

(86) PCT No.: PCT/JP2020/048708
§ 371 (c)(1),
(2) Date: Sep. 8, 2022

(87) PCT Pub. No.: WO2021/181831
PCT Pub. Date: Sep. 16, 2021

(65) Prior Publication Data
US 2023/0119278 A1   Apr. 20, 2023

(30) Foreign Application Priority Data
Mar. 9, 2020   (JP) ................. 2020-039863

(51) Int. Cl.
*H01L 25/18*   (2023.01)
*H01L 21/56*   (2006.01)
(Continued)

(52) U.S. Cl.
CPC .............. *H01L 25/18* (2013.01); *H01L 21/56* (2013.01); *H01L 23/3107* (2013.01);
(Continued)

(58) Field of Classification Search
None
See application file for complete search history.

(56) References Cited

U.S. PATENT DOCUMENTS

| | | | |
|---|---|---|---|
| 2005/0012206 A1* | 1/2005 | Nakamura | H01L 23/4334 257/E23.098 |
| 2009/0224398 A1* | 9/2009 | Noritake | H01L 24/32 438/122 |

(Continued)

FOREIGN PATENT DOCUMENTS

| | | |
|---|---|---|
| DE | 10 2018 210 855 A1 | 4/2019 |
| JP | 2005-012163 A | 1/2005 |

(Continued)

OTHER PUBLICATIONS

International Search Report with English Translation and Written Opinion issued for PCT Appl. Ser. No. PCT/JP2020/048708 dated Apr. 20, 2021 (9 pages).

(Continued)

*Primary Examiner* — Sue A Purvis
*Assistant Examiner* — Jordan M Klein
(74) *Attorney, Agent, or Firm* — Foley & Lardner LLP

(57) ABSTRACT

Provided is an electric circuit body including: a power semiconductor element; a first conductor plate configured to be connected to one surface of the power semiconductor element; a first sheet-shaped member having a first resin insulation layer and configured to at least cover a surface of the first conductor plate; a sealing material configured to seal each of the power semiconductor element, the first conductor plate, and an end of the first sheet-shaped member; and a first cooling member configured to be adhesively attached to the first sheet-shaped member. In the electric circuit body, the first sheet-shaped member includes: an embedded portion where the end of the first sheet-shaped member is covered with the sealing material; a heat dissipation surface (Continued)

as a region to overlap the surface of the first conductor plate; and a margin as a region between the embedded portion and the heat dissipation surface, the margin is located more inward than the heat dissipation surface, and the embedded portion is located more inward than the margin.

12 Claims, 15 Drawing Sheets

(51) Int. Cl.
    *H01L 23/00*     (2006.01)
    *H01L 23/31*     (2006.01)
    *H01L 23/473*     (2006.01)
    *H01L 23/495*     (2006.01)
    *H01L 25/07*     (2006.01)
    *H02M 7/00*     (2006.01)
    *H02P 27/06*     (2006.01)

(52) U.S. Cl.
    CPC ...... *H01L 23/473* (2013.01); *H01L 23/49568* (2013.01); *H01L 25/072* (2013.01); *H02M 7/003* (2013.01); *H01L 23/49575* (2013.01); *H01L 24/32* (2013.01); *H01L 24/40* (2013.01); *H01L 24/48* (2013.01); *H01L 24/73* (2013.01); *H01L 2224/32245* (2013.01); *H01L 2224/40137* (2013.01); *H01L 2224/48245* (2013.01); *H01L 2224/73221* (2013.01); *H01L 2224/73263* (2013.01); *H01L 2224/73265* (2013.01); *H02P 27/06* (2013.01)

(56) References Cited

U.S. PATENT DOCUMENTS

| | | | |
|---|---|---|---|
| 2014/0168901 A1* | 6/2014 | Ide | H01L 23/49575 361/717 |
| 2014/0353814 A1* | 12/2014 | Sakamoto | H01L 23/367 438/122 |
| 2016/0079143 A1* | 3/2016 | Sakamoto | H01L 23/3675 438/122 |
| 2019/0109059 A1 | 4/2019 | Ohara et al. | |

FOREIGN PATENT DOCUMENTS

| | | |
|---|---|---|
| JP | 2009-212302 A | 9/2009 |
| JP | 2011-009410 A | 1/2011 |
| JP | 2013-258334 A | 12/2013 |
| JP | 2016-092266 A | 5/2016 |
| WO | WO-2013/124988 A1 | 8/2013 |
| WO | WO-2018/159209 A1 | 9/2018 |

OTHER PUBLICATIONS

German Office Action issued in corresponding DE Application No. 112020006116.7 with English translation (6 pages).

* cited by examiner

ELECTRIC CIRCUIT BODY, POWER CONVERSION DEVICE, AND METHOD FOR MANUFACTURING ELECTRIC CIRCUIT BODY

TECHNICAL FIELD

The present invention relates to an electric circuit body, a power conversion device, and a method for manufacturing the electric circuit body.

BACKGROUND ART

A power conversion device including a power semiconductor element used in switching operations has high conversion efficiency and is thus widely used in consumer products, vehicles, railway, substation equipment, or others. The power semiconductor element generates heat when energized, so that greater heat dissipation is required of the power conversion device. When used in a vehicle, for example, a highly efficient power conversion device using a water-cooling system is adopted to meet a demand for smaller size and weight.

PTL 1 discloses an electric circuit body that includes a mold resin configured to seal a semiconductor element and a heat sink, the mold resin having a recess positioned to surround a heat dissipation surface, and an insulation sheet configured to cover an entire portion of the heat dissipation surface while having an end of the insulation sheet bonded into the recess of the mold resin.

CITATION LIST

Patent Literature

PTL 1: JP 2013-258334 A

SUMMARY OF INVENTION

Technical Problem

In the electric circuit body disclosed in PTL 1, when a cooling member is adhesively attached to the heat dissipation surface, the electric circuit body may be warped, causing adhesion between the heat dissipation surface and the cooling member to be reduced, and thus degrading heat dissipation.

Solution to Problem

The present invention provides an electric circuit body including: a power semiconductor element; a first conductor plate configured to be connected to one surface of the power semiconductor element; a first sheet-shaped member having a first resin insulation layer and configured to at least cover a surface of the first conductor plate; a sealing material configured to seal each of the power semiconductor element, the first conductor plate, and an end of the first sheet-shaped member; and a first cooling member configured to be adhesively attached to the first sheet-shaped member. In the electric circuit body, the first sheet-shaped member includes: an embedded portion where the end of the first sheet-shaped member is covered with the sealing material; a heat dissipation surface as a region to overlap the surface of the first conductor plate; and a margin as a region between the embedded portion and the heat dissipation surface, the margin is located more inward than the heat dissipation surface, and the embedded portion is located more inward than the margin.

The present invention provides a method for manufacturing an electric circuit body, the method configured to seal, with a sealing material, a power semiconductor element, a first conductor plate to be connected to one surface of the power semiconductor element, and a first sheet-shaped member having a first resin insulation layer and configured to at least cover a surface of the first conductor plate. The method includes: with the first sheet-shaped member including an embedded portion where an end of the first sheet-shaped member is covered with the sealing material, a heat dissipation surface as a region to overlap the surface of the first conductor plate, and a margin as a region between the embedded portion and the heat dissipation surface, a first step of locating the embedded portion more inward than the heat dissipation surface and the margin, and sealing with the sealing material; a second step of inducing a curing shrinkage of the sealing material to locate the margin more inward than the heat dissipation surface; and a third step of attaching a cooling member adhesively to the first sheet-shaped member.

Advantageous Effects of Invention

The present invention provides an electric circuit body where even when the electric circuit body is warped, a cooling member is securedly attached therein and heat dissipation is thus not degraded.

DESCRIPTION OF EMBODIMENTS

Figure 1:
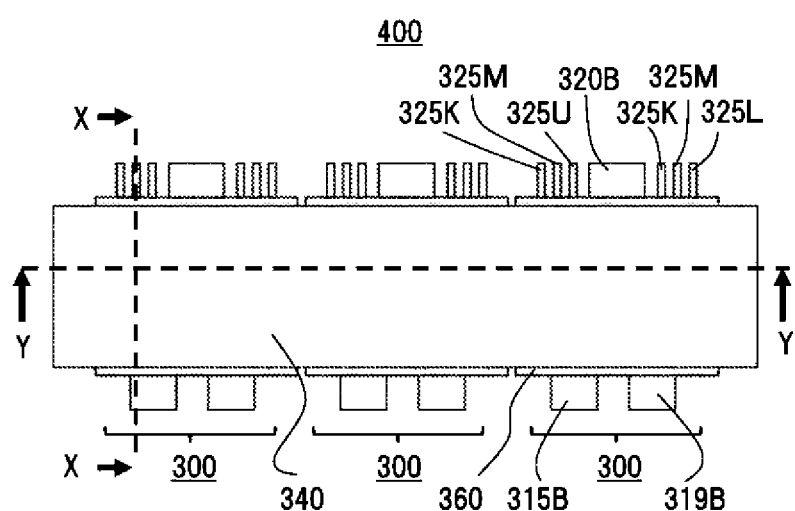
FIG. 1 is a plan view of an electric circuit body.

An embodiment of the present invention will be described below with reference to the drawings. Descriptions below and the drawings are merely illustrative for convenience of describing the present invention, and are omitted or simplified as appropriate for clarification of the description. The present invention may be implemented in other various manners. Unless otherwise limited, each component may be singular or plural.

A position, size, shape, range, or the like of each component illustrated in the drawings may not necessarily represent an actual position, size, shape, range, or the like, in order to facilitate understanding of the present invention. Accordingly, the present invention is not necessarily limited to the position, size, shape, range, or the like disclosed in the drawings.

Figure 2:
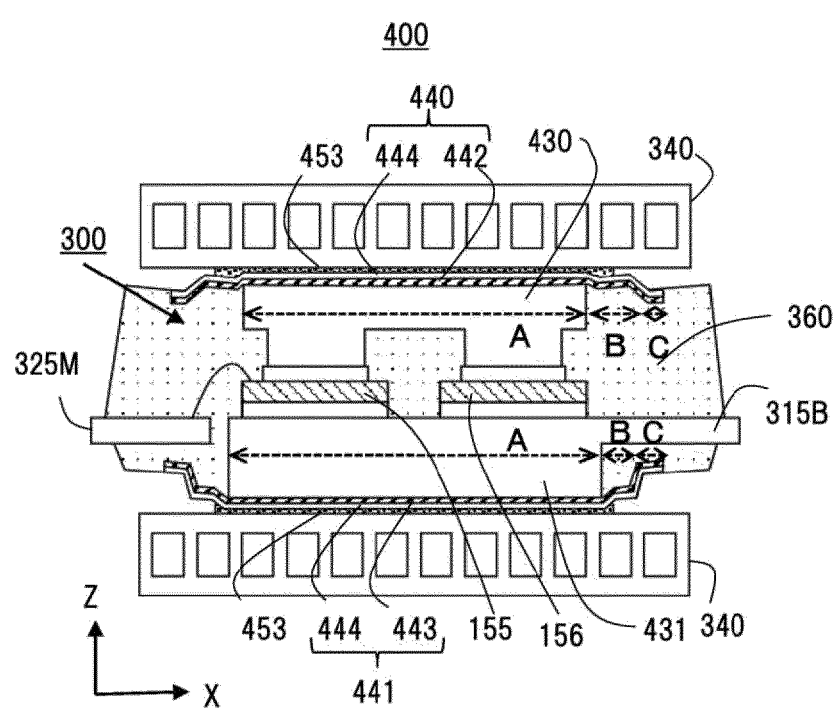
FIG. 2 is a cross-sectional view of the electric circuit body, taken along line X-X in FIG. 1.
Figure 3:
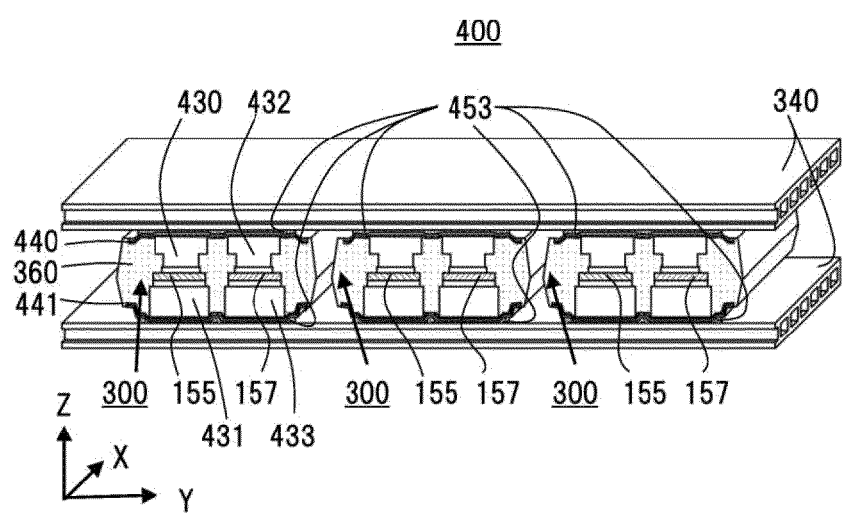
FIG. 3 is a cross-sectional view of the electric circuit body, taken along line Y-Y in FIG. 1.

FIG. 1 is a plan view of an electric circuit body 400 according to this embodiment. FIG. 2 is a cross-sectional view of the electric circuit body 400, taken along line X-X in FIG. 1. FIG. 3 is a cross-sectional view of the electric circuit body 400 taken along line Y-Y in FIG. 1.

As illustrated in FIG. 1, the electric circuit body 400 includes power modules 300, the number of which is three, and a cooling member 340. Each of the power modules 300 has a function to convert power between DC and AC using a semiconductor element, and generates heat when energized. Thus, the cooling member 340 has a refrigerant flowing therein to cool down the power module 300. Water, an antifreeze liquid containing ethylene glycol with water, or others is used as the refrigerant. The cooling member 340 may have pin-shaped fins standing on a base plate of the cooling member 340. The cooling member 340 is desirably made of aluminum having high heat conductivity and light weight. The cooling member 340 is manufactured by extrusion molding, forging, brazing, or others.

Each of the power modules 300 includes, at one side, a positive electrode side terminal 315B and a negative electrode side terminal 319B, each connected to a capacitor module 500 of a DC circuit (see FIG. 14 as will be described later).

At the other side (a side opposite to the positive electrode side terminal 315B and the negative electrode side terminal 319B), each of the power modules 300 includes power terminals, through which a large current flows, such as an AC side terminal 320B; and the power terminals are connected to a motor generator 192 or a motor generator 194 of an AC circuit (see FIG. 14 as will be described later). Each of the power modules 300 also includes, at the other side, signal terminals or others used to control the corresponding power module 300, such as a lower arm gate signal terminal 325L, a mirror emitter signal terminal 325M, a Kelvin emitter signal terminal 325K, an upper arm gate signal terminal 325U, a mirror emitter signal terminal 325M, and a Kelvin emitter signal terminal 325K.

As illustrated in FIG. 2, each of the power modules 300 includes an upper arm circuit active element 155 and an upper arm circuit diode 156, each as a first power semiconductor element forming an upper arm circuit. As a semiconductor material for the upper arm circuit active element 155, for example, Si, SiC, GaN, GaO, C, or others may be used. When a body diode of the upper arm circuit active element 155 is used, the upper arm circuit diode 156 may be omitted. The upper arm circuit active element 155 has its collector electrode and the upper arm circuit diode 156 has its cathode electrode, both bonded to a second conductor plate 431. The upper arm circuit active element 155 has its emitter electrode and the upper arm circuit diode 156 has its anode electrode, both bonded to a first conductor plate 430. Each of the upper arm circuit active element 155 and the upper arm circuit diode 156 may be bonded to the first conductor plate 430 and the second conductor plate 431 by soldering or sintered metal. The first conductor plate 430 and the second conductor plate 431 may be formed of any materials having high electrical conductivity and heat conductivity, but are desirably formed of a copper-based or aluminum-based material. These materials may be used alone or alternatively, may be nickel-plated or silver-plated such that the first conductor plate 430 and the second conductor plate 431 are bonded more firmly by soldering or sintered metal. The first conductor plate 430 has a recess at an outer periphery of a region connected to the first power semiconductor elements 155 and 156, so as to secure an insulation distance (see FIG. 4 as will described in detail later).

The first conductor plate 430 is to be adhesively attached to a first sheet-shaped member 440, and further with the cooling member 340 via a heat conductor member 453. The first sheet-shaped member 440 includes a first resin insulation layer 442 and a metal foil 444, each layered on the other, and the metal foil 444 is adhesively attached to the heat conductor member 453.

The second conductor plate 431 is to be adhesively attached to a second sheet-shaped member 441, and further with a cooling member 340 via a heat conductor member 453. The second sheet-shaped member 441 includes a second resin insulation layer 443 and a metal foil 444, each layered on the other, and the metal foil 444 is adhesively attached to the heat conductor member 453.

As illustrated in FIG. 3, each of the power modules 300 includes a lower arm circuit active element 157 and a lower arm circuit diode 158 (see FIGS. 12 and 13 as will be described later), each as a second power semiconductor element forming a lower arm circuit. In FIG. 3, the lower arm circuit diode 158 is disposed at back of the lower arm circuit active element 157 in an X-axis direction. The lower arm circuit active element 157 has its collector electrode and the lower arm circuit diode 158 has its cathode electrode, both bonded to a fourth conductor plate 433. The lower arm circuit active element 157 has its emitter electrode and the lower arm circuit diode 158 has its anode electrode, both bonded to a third conductor plate 432.

As will be described in detail later, FIG. 2 illustrates the first sheet-shaped member 440 and the second sheet-shaped member 441, each including an embedded portion C covered with a sealing material 360, a heat dissipation surface A as a region to overlap a surface of the first conductor plate 430 or a surface of the second conductor plate 431, and a margin B as a region between the embedded portion C and the heat dissipation surface A. In each of the first sheet-shaped member 440 and the second sheet-shaped member 441, the margins B is located more inward of the electric circuit body 400 than the heat dissipation surface A (in a Z-axis direction), and the embedded portion C is located more inward of the electric circuit body 400 than the margin B (in the Z-axis direction).

As illustrated in FIG. 3, each of the first conductor plate 430, the second conductor plate 431, the third conductor plate 432, and the fourth conductor plate 433 has a role of passing electric current, and is additionally configured to serve as a heat transfer member that transfers heat generated by the first power semiconductor elements 155 and 156 or the second power semiconductor elements 157 and 158 to the corresponding cooling member 340. Each of the first conductor plate 430, the second conductor plate 431, the third conductor plate 432, and the fourth conductor plate 433 is different in electric potential from the corresponding cooling member 340. Thus, as illustrated in FIG. 2, each of the first conductor plate 430, the second conductor plate 431, the third conductor plate 432, and the fourth conductor plate 433 has the first sheet-shaped member 440 (including the first resin insulation layer 442) or the second sheet-shaped member 441 (including the second resin insulation layer 443) interposed between thereof and the corresponding cooling member 340. Each of the first sheet-shaped member 440 and the second sheet-shaped member 441 has the corresponding heat conductor member 453 interposed between thereof and the corresponding cooling member 340, so that contact heat resistance is reduced.

The heat conductor member 453 may be formed of any materials having high heat conductivity, but is preferably formed of a high heat conductor material such as a metal, a ceramic, or a carbon-based material, in combination with a resin material.

With this configuration, the resin material fills between the heat conductor member 453 and the cooling member 340 as well as between the heat conductor member 453 and each of the first sheet-shaped member 440 and the second sheet-shaped member 441, so that the contact heat resistance is reduced.

The first power semiconductor elements 155 and 156, the second power semiconductor elements 157 and 158, the first conductor plate 430, the second conductor plate 431, the third conductor plate 432, the fourth conductor plate 433, the first sheet-shaped members 440, and the second sheet-shaped member 441 are sealed with the sealing material 360 by transfer molding. Each of the first resin insulation layer 442 of the first sheet-shaped member 440 and the second resin insulation layer 443 of the second sheet-shaped member 441 may be any type as long as being attachable to a corresponding one of the first conductor plate 430, the second conductor plate 431, the third conductor plate 432, and the fourth conductor plate 433, but is desirably an epoxy resin-based resin insulation layer where a powdery inorganic filler is dispersed. The epoxy resin-based resin insulation layer shows good balance between adhesiveness and heat dissipation. Each of the first sheet-shaped member 440 and the second sheet-shaped member 441 may include the corresponding resin insulation layer only, but desirably includes the metal foil 444 at its side to be in contact with the corresponding heat conductor member 453. In the transfer molding process, when each of the first sheet-shaped member 440 and the second sheet-shaped member 441 is mounted on a mold, the corresponding sheet-shaped member and the mold have a mold release sheet or the metal foil 444 therebetween. With this configuration, each of the first sheet-shaped member 440 and the second sheet-shaped member 441 is not attached to the mold. The mold release sheet has low heat conductivity and thus, when the transfer molding has completed, a process of peeling off the mold release sheet is required. On the other hand, the metal foil 444 is formed of copper-based or aluminum-based metal that is greater in heat conductivity, so that when the transfer molding has completed, the process of peeling off the metal foil is not required. The first sheet-shaped member 440 and the second sheet-shaped member 441 are included in the transfer molding, so that an end of each of the first sheet-shaped member 440 and the second sheet-shaped member 441 is covered with the sealing material 360, leading to improved reliability of a product.

Figure 4:
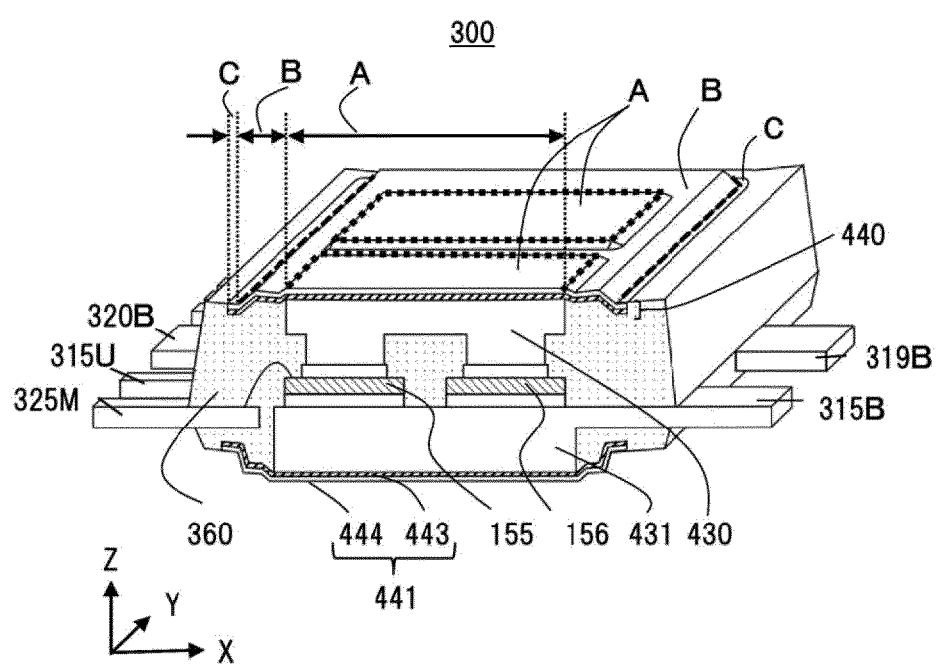
FIG. 4 is a cross-sectional perspective view of a power module, taken along line X-X in FIG. 1.
Figure 5:
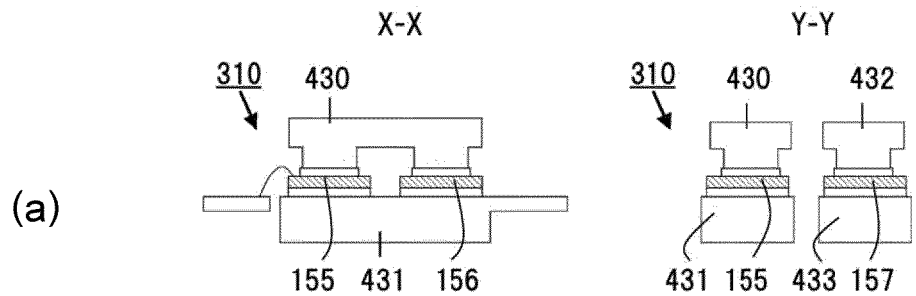
FIGS. 5(a) to 5(c) are cross-sectional views illustrating a method for manufacturing the electric circuit body.
Figure 5:
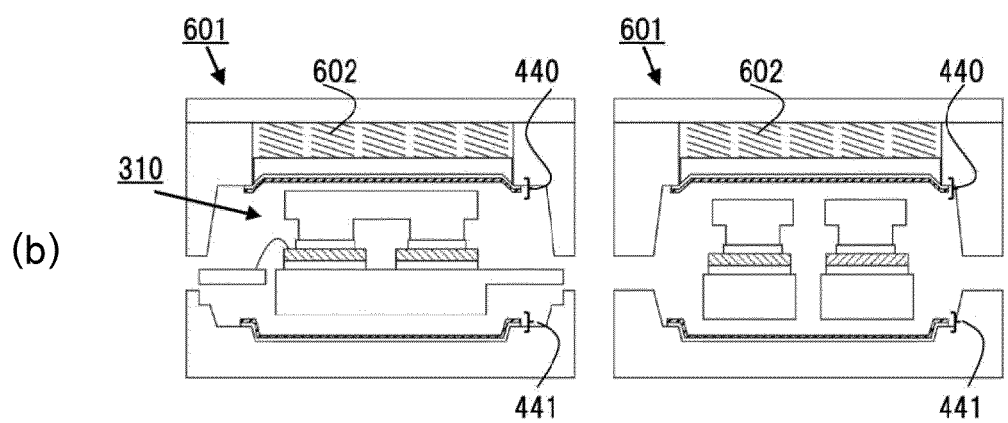
Figure 5:
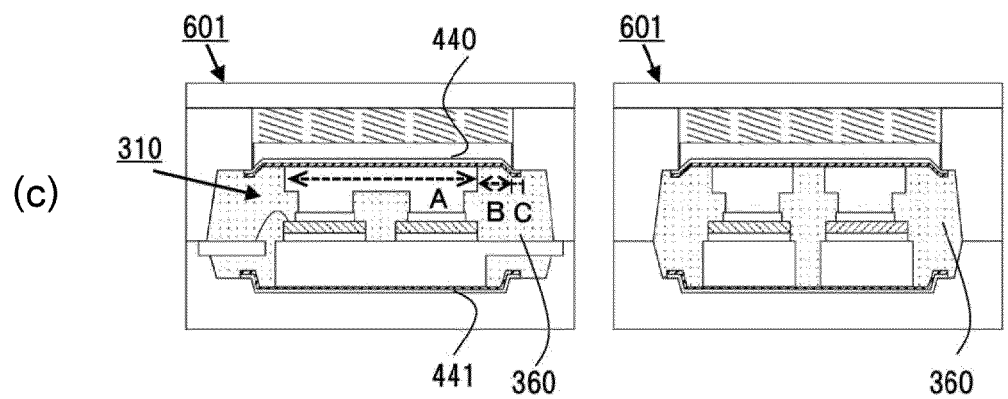

FIG. 4 is a cross-sectional perspective view of one of the power modules 300 taken along line X-X in FIG. 1, and illustrates a state where the cooling member 340 has been removed from the electric circuit body 400. As illustrated in FIG. 4, the first sheet-shaped member 440 includes the embedded portion C covered with the sealing material 360, the heat dissipation surface A as the region to overlap the surface of the first conductor plate 430, and the margin B as the region between the embedded portion C and the heat dissipation surface A. In the first sheet-shaped member 440, the margin B is located more inward of the power module 300 than the heat dissipation surface A, and the embedded portion C is located more inward of the power module 300 than the margin B. Accordingly, with the first sheet-shaped member 440 having the corresponding cooling member 340 attached adhesively thereto, even when the electric circuit body 400 is warped, the first sheet-shaped member 440 securely has the corresponding cooling member 340 attached thereto, and thus the heat dissipation is not degraded.

FIGS. 5(a), 5(b), 5(c), 6(d), 6(e) and 6(f) are cross-sectional views illustrating a method for manufacturing the electric circuit body 400. Each of FIGS. 5(a) to 6(f) has, on its left, a cross-sectional view illustrating one of the power modules, taken along line X-X in FIG. 1, and has on its right, a cross-sectional view illustrating the one of the power modules, taken along line Y-Y in FIG. 1.

FIG. 5(a) illustrates a soldering process and a wire bonding process. The upper arm circuit active element 155 and the upper arm circuit diode 156 as the first power semiconductor elements respectively have the collector electrode and the cathode electrode connected to the second conductor plate 431; and the upper arm circuit active element 155 has its gate electrode connected by wire bonding. The upper arm circuit active element 155 and the upper arm circuit diode 156 respectively have the emitter electrode and the anode electrode connected to the first conductor plate 430. Similarly, the lower arm circuit active element 157 and the lower arm circuit diode 158 as the second power semiconductor elements respectively have the collector electrode and the cathode electrode connected to the fourth conductor plate 433; and the lower arm circuit active element 157 has its gate electrode connected by wire bonding. The lower arm circuit active element 157 and the lower arm circuit diode 158 respectively have the emitter electrode and the anode electrode connected to the third conductor plate 432.

FIG. 5(b) illustrates a process of installing the power module in the molds. A transfer molding device 601 has the first sheet-shaped member 440, the second sheet-shaped member 441, and a spring 602 vacuum-absorbed to the molds. While not illustrated here, the transfer molding device 601 has a vacuum degassing mechanism or others such that the first sheet-shaped member 440 and the second sheet-shaped member 441 are vacuum-absorbed to the molds. The molds are pre-heated to a constant temperature of 175° C.; and the first sheet-shaped member 440 and the second sheet-shaped member 441 are respectively positioned by a jig, and vacuum-absorbed to be held in the molds. Then, a circuit body 310 that has been preheated to 175° C. is placed inside the molds while spaced from first sheet-shaped member 440 and the second sheet-shaped member 441.

FIG. 5(c) illustrates a transfer molding process. In a state where the circuit body 310 is spaced from the first sheet-shaped member 440 and the second sheet-shaped member 441, the molds as an upper mold and a lower mold are brought closer, and only a packing seal (not illustrated) around the upper mold and a packing seal (not illustrated) around the lower mold are brought into contact with each other. Next, a cavity of the molds is evacuated. When the cavity of the molds has been evacuated to below a predetermined pressure, the upper and lower molds are fully clamped such that the packing seals are further crushed. In this state, the circuit body 310 are brought into contact with the first sheet-shaped member 440 and the second sheet-shaped member 441. In this vacuum state, the circuit body 310 is in contact with the first sheet-shaped member 440 and the second sheet-shaped member 441, to which the spring 602 applies pressure. Accordingly, the circuit body 310 is adhesively attached to the first sheet-shaped member 440 and the second sheet-shaped member 441 without void.

Next, the sealing material 360 is injected into the cavity of the molds. Each of the molds used for the transfer molding has a shape where the heat dissipation surface A and the margin B are located at the same level and not located inward, while the embedded portion C is located more inward than the heat dissipation surface A and the margin B. That is, in this process, when sealed with the sealing material 360, the embedded portion C is located more inward than the heat dissipation surface A and the margin B. In other words, when sealed with the sealing material 360, the heat dissipation surface A and the margin B, both positioned at the same level, are not located inward, while the embedded portion C is located inward.

FIG. 6(d) illustrates a curing process. The power module 300 that has been sealed with the sealing material 360 is removed from the transfer molding device 601, cooled at room temperature, and then cured for two or more hours. As a result, due to a curing shrinkage and a cooling shrinkage of the sealing material 360, the margin B is located more inward of the power module 300 than the heat dissipation surface A. The embedded portion C is located more inward of the power module 300 than the margin B. Particularly, the power module 300 includes, at one side in the X-axis direction, the positive electrode side terminal 315B and the negative electrode side terminal 319B, each connected to the capacitor module 500 (see FIG. 14 as will be described later); and the power module 300 includes, at the other side in the X-axis direction, the power terminals, such as the AC side terminal 320B connected to the motor generator 192 or the motor generator 194 of the AC circuit (see FIG. 14 as will be described later). With this configuration, at both ends of the power module 300 in the X-axis direction, an increased amount of the sealing material 360 is used. Thus, the curing shrinkage and the cooling shrinkage of the sealing material 360 effectively causes the margin B to be located more inside of the power module 300 than the heat dissipation surface A.

FIG. 6(e) illustrates a process of fitting each of the cooling members 340. Each of the cooling members 340 is pressed against a corresponding surface of the power module 300 via the corresponding heat conductor member 453. As a result, each of the cooling members 340 is adhesively attached to the first sheet-shaped member 440 or the second sheet-shaped member 441 via the corresponding heat conductor member 453.

FIG. 6(f) illustrates the electric circuit body 400 that has been manufactured in these processes. As has been described above, each of the power modules 300 has the cooling members 340 fitted to its both surfaces, as a part of manufacturing of the electric circuit body 400.

Figure 7:
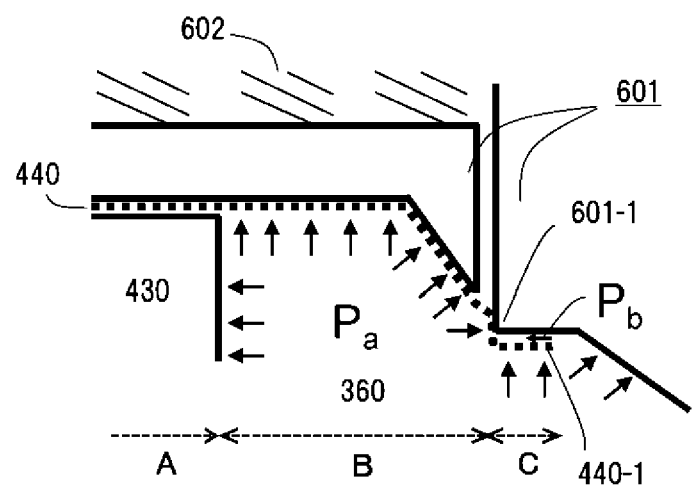
FIG. 7 illustrates a vicinity of an end of a first sheet-shaped member.

FIG. 7 illustrates a vicinity of the end of the first sheet-shaped member 440 in the transfer molding process of FIG. 5(c). In FIG. 7, the first sheet-shaped member 440 is illustrated with a broken line. The first sheet-shaped member 440 is pressed onto the first conductor plate 430 by the transfer molding device 601. Then, the first sheet-shaped member 440 and the first conductor plate 430 are sealed with the sealing material 360.

The embedded portion C of the first sheet-shaped member 440 is located more inward than the margin B, and thus, the end of the first sheet-shaped member 440 is covered with the sealing material 360 at the embedded portion C. With this configuration, the embedded portion C protects the margin B from the sealing material 360 or resin burr made of resin in the sealing material 360 flowing in from between the first sheet-shaped member 440 and the mold.

While being vacuum-absorbed to the mold in the transfer molding device 601, the first sheet-shaped member 440 has absorption force that is significantly smaller than a molding pressure Pa of the sealing material 360 injected. Additionally, when the mold (into which the sealing material 360 is to be injected) is evacuated for vacuum molding, the adsorption force is further reduced. Accordingly, the sealing material 360 or the resin burr made of the resin in the sealing material 360 flows from an outer peripheral portion (end) 440-1 of the first sheet-shaped member 440 into between the first sheet-shaped member 440 and the mold of the transfer molding device 601. In this state, with the mold manufactured to have a projection 601-1 slightly more inward than the outer peripheral portion (end) 440-1 of the first sheet-shaped member 440, the projection 601-1 serves as a stopper against the sealing material 360 or the resin burr.

The projection 601-1 serves as the stopper against the sealing material 360 or the resin burr as follows: As illustrated in FIG. 7, when the sealing material 360 flows into the mold, first, due to the molding pressure Pa generated by the sealing material 360 flowing, the first sheet-shaped member 440 is pressed to the mold; and then, when the mold has been substantially filled in with the sealing material 360, a final one of the molding pressure Pa that is greater than the previous one is applied to the sealing material 360 as hydrostatic pressure. In this state, the sealing material 360 also flows into small gaps, and the sealing material 360 or the resin burr flows from the outer peripheral portion (end) 440-1 of the first sheet-shaped member 440 into a narrow gap between the first sheet-shaped member 440 and the mold. The gap is narrow, however, causing a loss in pressure Pb of the sealing material 360 flowing in. When the sealing material 360 flowing in the narrow gap between the first sheet-shaped member 440 and the mold has reached the projection 601-1, the pressure Pb of the sealing material 360 (flowing in the narrow gap between the first sheet-shaped member 440 and the mold) acts in a direction opposite to the molding pressure Pa (pressing the first sheet-shaped member 440 to the mold). Here, the molding pressure Pa pressing the first sheet-shaped member 440 to the mold is greater than the pressure Pb flowing in the narrow gap, which thus causes the sealing material 360 to stop flowing in between the first sheet-shaped member 440 and the mold at the projection 601-1. Particularly, even with a part of the projection 601-1 having substantially a right angle shape, the molding pressure Pa (pressing the first sheet-shaped member 440 to the mold) fully acts against the pressure Pb (of the sealing material 360 flowing in the narrow gap between the first sheet-shaped member 440 and the mold), thereby effectively preventing the sealing material 360 or the resin burr. With this configuration, at the embedded portion C, the outer peripheral portion (end) 440-1 of the first sheet-shaped member 440 is covered with the sealing material 360 or the resin burr.

Figure 6:
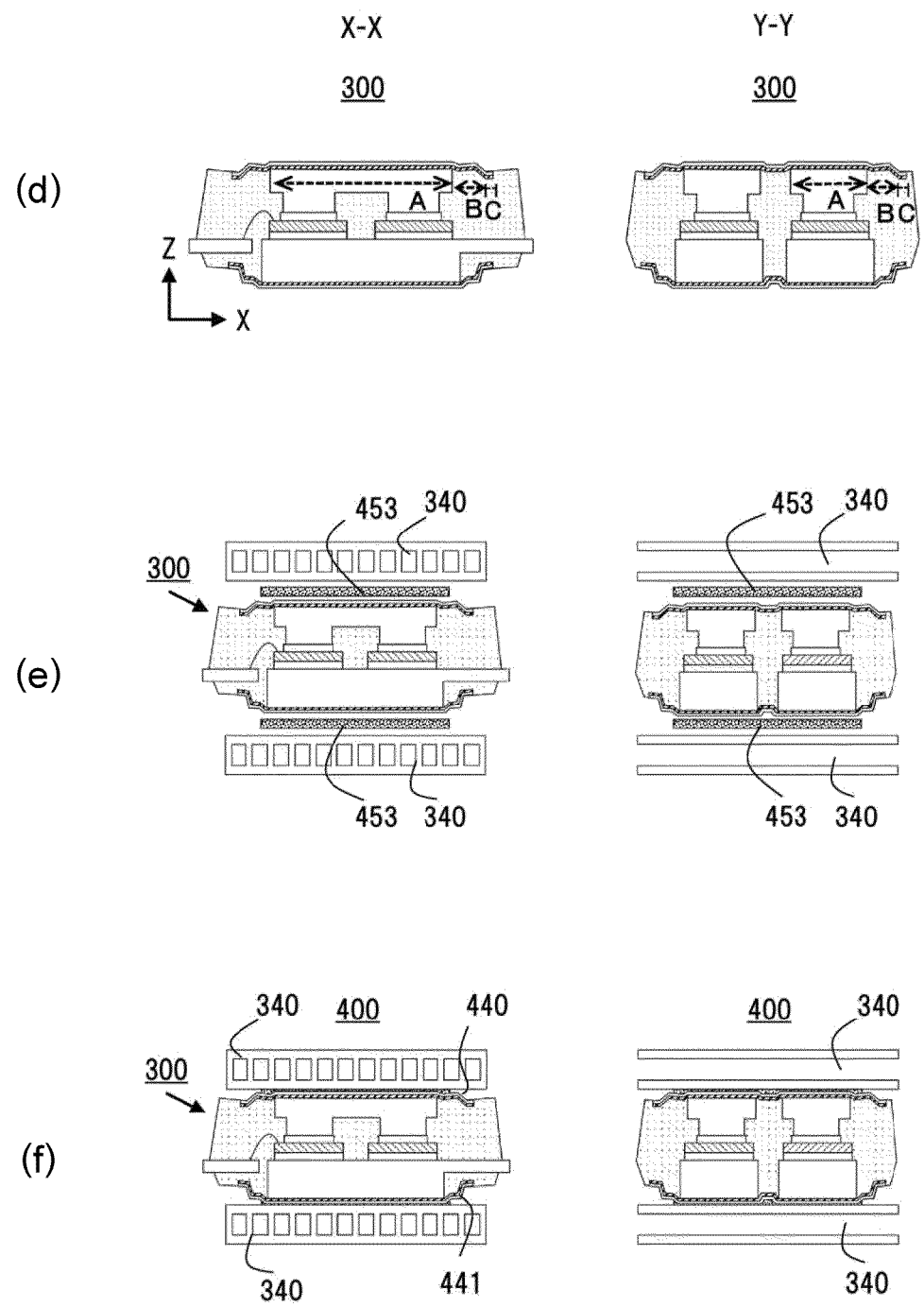
FIGS. 6(d) to 6(f) are cross-sectional views illustrating a method for manufacturing the electric circuit body.

As a result of the curing process of FIG. 6(*d*), the margin B is located more inward than the heat dissipation surface A, and the embedded portion C is located more inward than the margin B. Accordingly, as will be described in detail later, even when the electric circuit body 400 is warped, the heat dissipation surface A is still pressed to the cooling member 340 by higher surface pressure.

Figure 8:
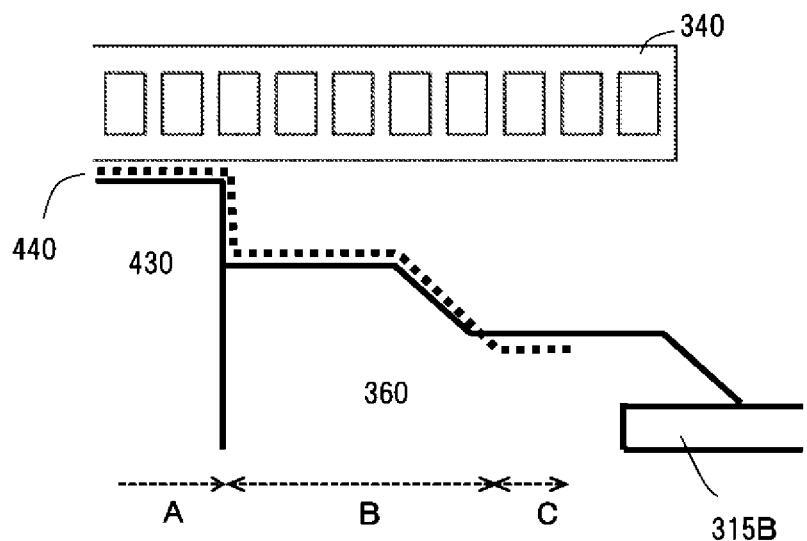
FIG. 8 illustrates in detail a vicinity of an end of a first sheet-shaped member according to a first modification.

FIG. 8 illustrates in detail a vicinity of an end of a first sheet-shaped member 440 according to a first modification.

In FIG. 8, the first sheet-shaped member 440 is illustrated with a broken line. The first sheet-shaped member 440 is disposed between the first conductor plate 430 and the cooling member 340. Then, as a result of the curing process of FIG. 6(*d*), a margin B is located more inward than a heat dissipation surface A, and an embedded portion C is located more inward than the margin B. In an example of the first modification, as the result of the curing process, the margin B is rapidly relocated more inward than the heat dissipation surface A, and the vicinity of the end of the first sheet-shaped member may be shaped as in the example.

Figure 9:
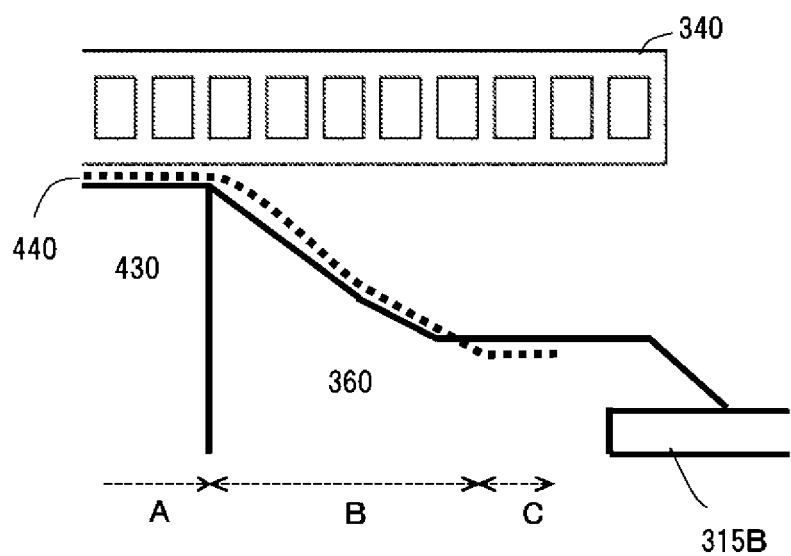
FIG. 9 illustrates in detail a vicinity of an end of a first sheet-shaped member according to a second modification.

FIG. 9 illustrates in detail a vicinity of an end of a first sheet-shaped member 440 according to a second modification.

In FIG. 9, the first sheet-shaped member 440 is illustrated with a broken line. The first sheet-shaped member 440 is disposed between the first conductor plate 430 and the cooling member 340. Then, as a result of the curing process of FIG. 6(*d*), a margin B is located more inward than a heat dissipation surface A, and an embedded portion C is located more inward than the margin B. In an example of the second modification, as the result of the curing process, the margin B is gradually relocated inward as away from the heat dissipation surface A, and the vicinity of the end of the first sheet-shaped member may be shaped as in the example.

In addition to the first modification and the second modification, the vicinity of the end of the first sheet-shaped member 440 may be shaped in other manners, as long as the margin B is located more inward than the heat dissipation surface A and the embedded portion C is located more inward than the margin B. For example, while not illustrated, the margin B may have a groove.

Figure 10:
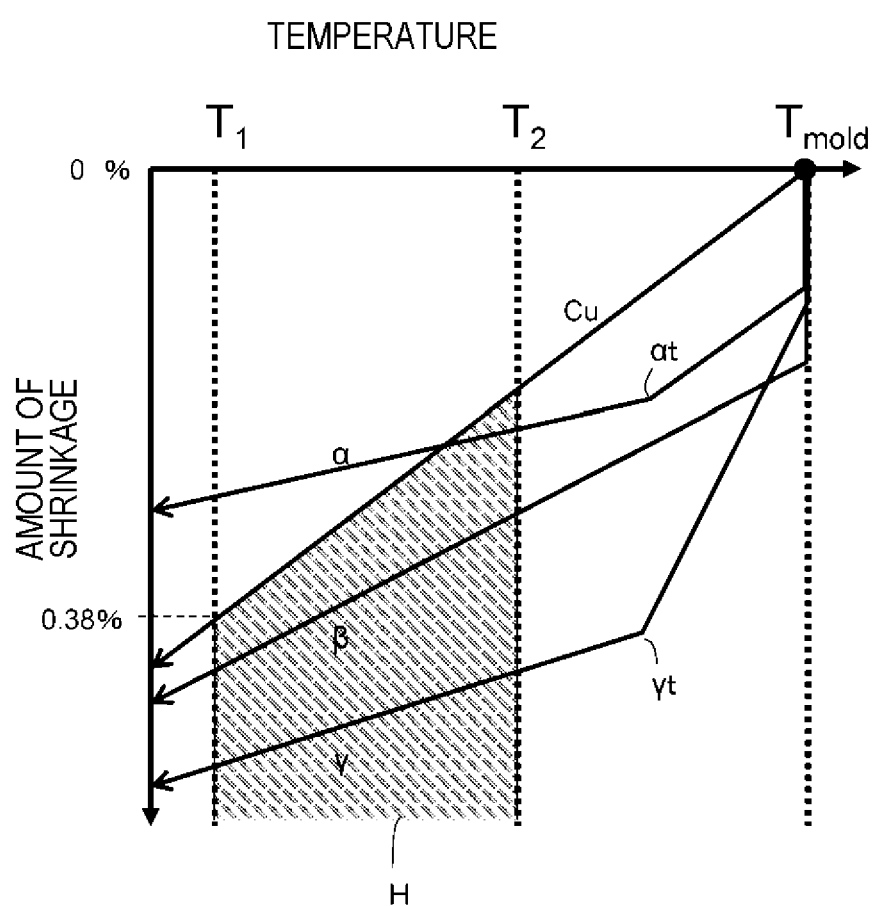
FIG. 10 illustrates a relationship between an amount of a shrinkage of a sealing material and a temperature.

FIG. 10 illustrates a relationship between an amount of the shrinkage of the sealing material 360 and a temperature. The horizontal axis represents the temperature, and the vertical axis represents the amount of the shrinkage.

For example, at a Tmold of 175° C., the sealing material 360 is injected into the molds in the transfer molding device 601. Based on a dimension immediately after the sealing material 360 is injected, a shrinkage of each component of the power module 300 in the Z-axis direction is to be focused. When respectively viewed from the emitter sides of the upper arm circuit active element 155 and the lower arm circuit active element 157 toward the collector sides thereof in the power module 300, the components are: the first sheet-shaped member 440; the first conductor plate 430 and the third conductor plate 432; the solder; the first power semiconductor elements 155/156 and the second power semiconductor elements 157/158; the solder; the second conductor plate 431 and the fourth conductor plate 433; and the second sheet-shaped member 441. Each of the first sheet-shaped member 440 and the second sheet-shaped member 441 includes the corresponding resin insulation layer and the corresponding metal foil, each layered on the other. Each of the resin insulation layers has a thickness of 100 μm to 500 μm; and each of the metal foils has a thickness of 30 μm to 200 μm. Each of the first conductor plate 430 and the second conductor plate 431 is formed of the copper-based material having a thickness of 1 mm to 5 mm. The solder is formed of a tin-based material having a thickness of 50 μm to 200 μm. The first power semiconductor elements 155 and 156 as well as the second power semiconductor elements 157 and 158 are each formed of a silicon-based material having a thickness of 80 μm to 200 μm.

The components are respectively formed of various materials, but in this embodiment, the amount of the shrinkage of each of the components in the Z-axis direction is represented by the copper-based material as the component having a greatest thickness, and is approximated by an amount of heat shrinkage of pure copper. When the sealing material 360 has been injected into the molds of the transfer molding device 601, the sealing material 360 exhibits curing reaction, leading to the curing shrinkage. The amount of the curing shrinkage varies in accordance with composition of the sealing material 360.

The amount of the curing shrinkage varies in accordance with a ratio of an epoxy resin component (exhibiting the curing reaction) and a ratio of the other fillers (not exhibiting the curing reaction); and when the ratio of the epoxy resin component is greater, the amount of the curing shrinkage is greater. Even when the ratio of the epoxy resin component is equivalent to the other, when a ratio of epoxy group as a reactive component in the epoxy resin component is greater, the amount of the curing shrinkage is greater. The power module 300 that has been removed from the molds of the transfer molding device 601 is cooled at the room temperature.

As seen in sealing materials α and γ of FIG. 10, having glass transition temperatures thereof αt and γt respectively lower than the Tmold, the sealing materials α and γ exhibit greater amounts of shrinkages until the temperature reaches the glass transition temperatures αt and γt; and when the temperature falls below the glass transition temperatures αt and γt, the sealing materials α and γ exhibit smaller amounts of shrinkages.

As seen in a sealing material β of FIG. 10, having its glass transition temperature higher than the Tmold, the sealing material β exhibits a constant amount of shrinkage. T1 represents a minimum value of a temperature of an operational environment of the power module 300, and T2 represents a maximum value of the temperature of the operational environment; and for example, the T1 corresponds to −40° C., and the T2 correspond to 125° C. Within a range of these temperatures, when the amount of the shrinkage is greater than copper Cu, in other words, when the amount of the shrinkage of the sealing material 360 falls within a hatched zone H in FIG. 10, the margin B is located more inward than the heat dissipation surface A at any operational temperatures ranging from the T1 to the T2. Here, the sealing material β and the sealing material γ are applicable to the sealing material 360 of this embodiment. The sealing material B is, for example, a polyfunctional epoxy resin (silica filler 66% by volume). The sealing material γ is, for example, a novolac epoxy resin (silica filler 66% by volume). With the sealing material α, the heat dissipation surface A is more inward than the margin B, and the sealing material α is thus not applicable to the sealing material 360 of this embodiment.

Due to a difference in amount of shrinkage between the sealing material 360 and the copper Cu, the sealing material 360 is located more inward of the electric circuit body 400 in the Z-axis direction.

In other words, the sealing material 360 is greater in amount of shrinkage with respect to temperature than the first conductor plate 430, the second conductor plate 431, the third conductor plate 432, or the fourth conductor plate 433. Accordingly, within a range of normal operational temperatures, each of the margin B and the embedded portion C is located more inward of the electric circuit body 400 than the heat dissipation surface A.

Additionally, the difference in amount of shrinkage between the sealing material 360 and the copper Cu causes the electric circuit body 400 to be warped in an X-Y direction. Typically, in the electric circuit body 400, the second conductor plate 431 and the fourth conductor plate 433 at the collector side are greater in volume than the first conductor plate 430 and the third conductor plate 432 at the emitter side. When the sealing material 360 is greater in shrinkage than the copper Cu, the sealing material 360 shrinks more than the copper Cu. In comparison between the emitter side and the collector side, the electric circuit body 400 has a greater proportion of the sealing material 360 at the emitter side than at the collector side. With this configuration, the electric circuit body 400 shrinks more at the emitter side than at the collector side, and is thus recessed/warped at the emitter side.

In a case of the electric circuit body 400 having a single-sided cooling structure where the cooling member 340 is provided at one side, even when the electric circuit body 400 is recessed at the emitter side, the heat is still dissipated at the collector side. This configuration hardly causes any concern. In a case of the electric circuit body 400 having a double-sided cooling structure where the cooling members 340 are provided at both sides, when the electric circuit body 400 is recessed/warped at the emitter side, the heat dissipation surface A is caused to have a greater distance from the cooling member 340 at the emitter side. Here, the heat dissipation is prone to be degraded.

Figure 11:
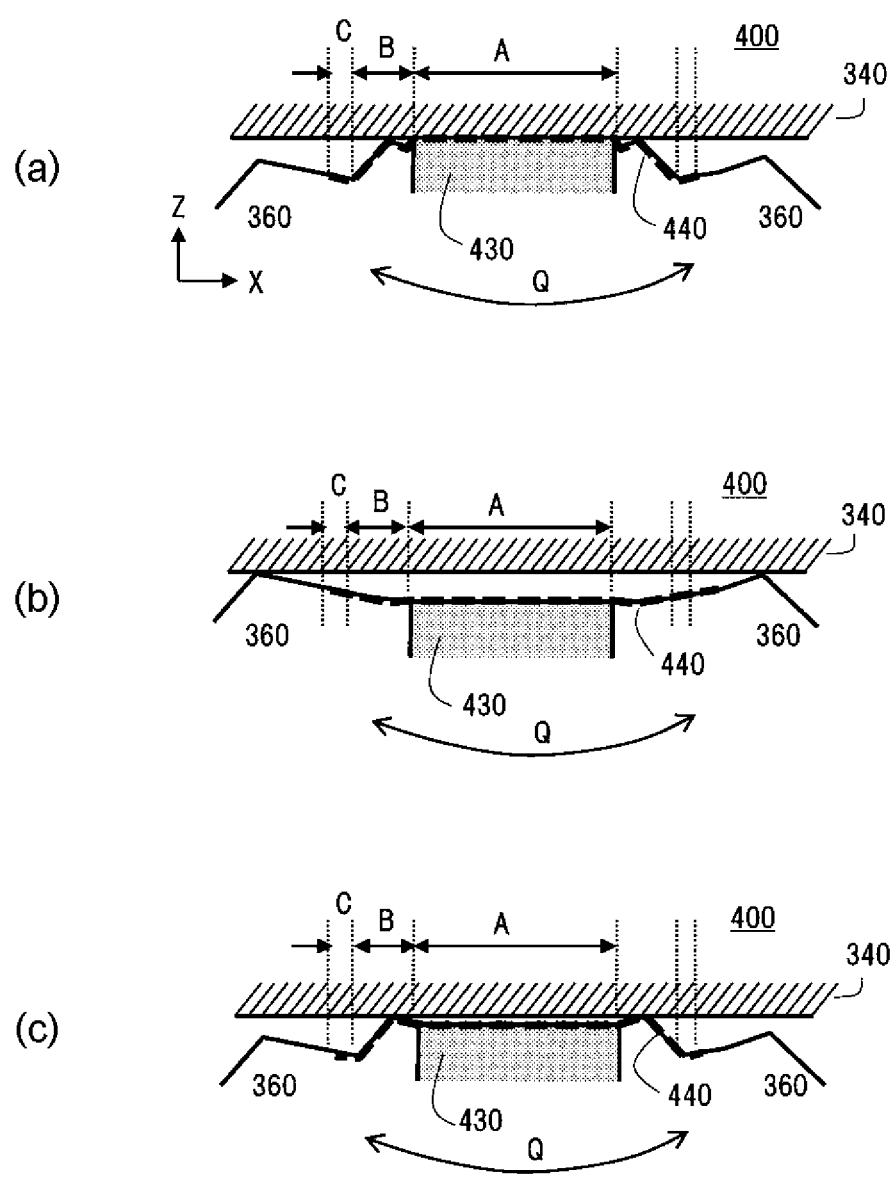
FIG. 11(a) is a schematic cross-sectional view of an electric circuit body according to this embodiment.
FIG. 11(b) is a schematic cross-sectional view of an electric circuit body according to a first comparative example.
FIG. 11(c) is a schematic cross-sectional view of an electric circuit body according to a second comparative example.

FIG. 11(a) is a schematic cross-sectional view of the electric circuit body 400 according to this embodiment; FIG. 11(b) is a schematic cross-sectional view of an electric circuit body according to a first comparative example; and FIG. 11(c) is a schematic cross-sectional view of an electric circuit body according to a second comparative example. Each of FIGS. 11(a) to 11(c) illustrates the electric circuit body having a warpage Q (recess) at the emitter side.

As illustrated in FIG. 11(a), in this embodiment, the margin B is located more inward than the heat dissipation surface A, and the embedded portion C is located more inward than the margin B. With this configuration, even when the electric circuit body 400 has the warpage Q, an end of the sealing material 360 does not abut the cooling member 340, and the heat dissipation surface A is thus adhesively attached to the cooling member 340. This configuration provides an effective heat dissipation. Particularly, the electric circuit body 400 has the warpage Q significantly in the X-direction thereof. Here, the amount of the sealing material 360 is increased at both ends of the electric circuit body 400 in the X-axis direction; and thus, the curing shrinkage and the cooling shrinkage of the sealing material 360 effectively causes the margin B to be located more inward of the power module 300 than the heat dissipation surface A.

On the other hand, as illustrated in FIG. 11(b), in the first comparative example, each of a margin B and an embedded portion C is not located more inward than a heat dissipation surface A. With this configuration, when the electric circuit body 400 has the warpage Q, each end of the sealing material 360 abuts the cooling member 340, thereby creating the distance between the heat dissipation surface A and the cooling member 340. Here, the heat dissipation is prone to be degraded.

Also, as illustrated in FIG. 11(c), in the second comparative example, an embedded portion C is located more inward than a margin B, while the margin B is not located more inward than a heat dissipation surface A. With this configuration, when the electric circuit body 400 has the warpage Q, the sealing material 360 in a vicinity of an end of the margin B abuts the cooling member 340, thereby creating a gap between the heat dissipation surface A and the cooling member 340. Here, the heat dissipation is prone to be degraded.

Figure 12:
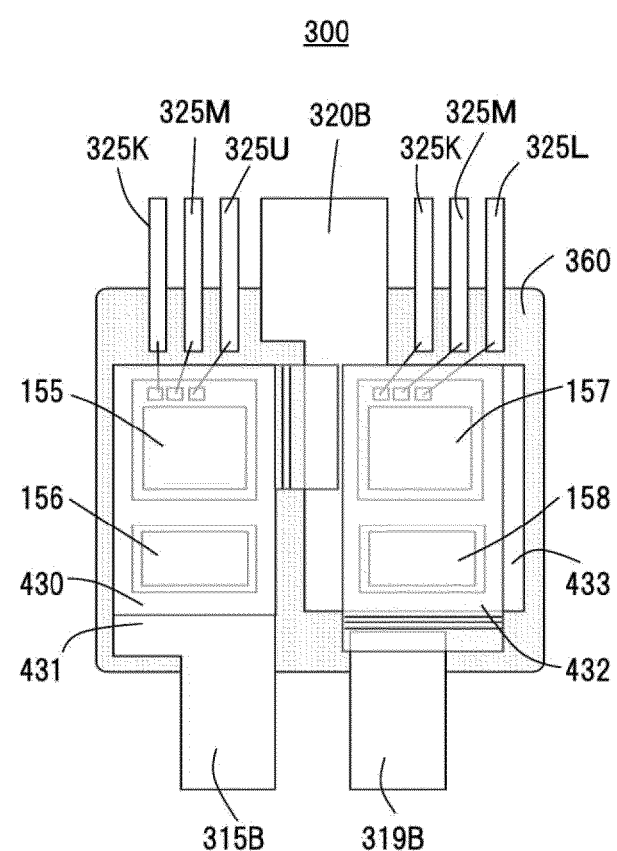
FIG. 12 is a semi-transparent plan view of a power module according to this embodiment.
Figure 13:
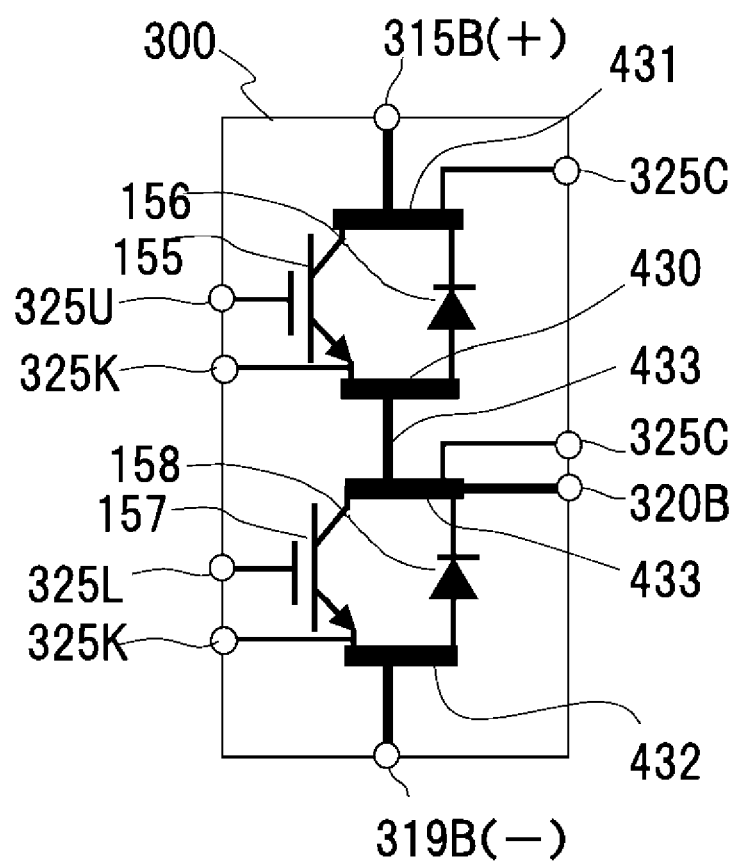
FIG. 13 is a circuit diagram of the power module according to this embodiment.

FIG. 12 is a semi-transparent plan view of the power module 300 according to this embodiment. FIG. 13 is a circuit diagram of the power module 300 according to this embodiment.

As illustrated in each of FIGS. 12 and 13, the positive electrode side terminal 315B is configured to output from the collector side of the upper arm circuit, and is connected to a positive electrode of a battery or the capacitor. The upper arm gate signal terminal 325U is configured to output from a gate and an emitter sense of the upper arm circuit active element 155. The negative electrode side terminal 319B is configured to output from the emitter side of the lower arm circuit, and is connected to a negative electrode of the battery or the capacitor, or connected to a ground (GND). The lower arm gate signal terminal 325L is configured to output from a gate and an emitter sense of the lower arm circuit active element 157. The AC side terminal 320B is configured to output from the collector side of the lower arm circuit, and is connected to the motor. When the system is neutral point grounded, the lower arm circuit is not connected to the GND but to the negative electrode of the capacitor.

Here, the first conductor plate (at the emitter side of the upper arm circuit) 430 and the second conductor plate (at the collector side of the upper arm circuit) 431 are respectively disposed above and below the upper arm circuit active element 155 and the upper arm circuit diode 156 as the first power semiconductor elements (upper arm circuit). The third conductor plate (at the emitter side of the lower arm circuit) 432 and the fourth conductor plate (at the collector side of the lower arm circuit) 433 are respectively disposed above and below the lower arm circuit active element 157 and the lower arm circuit diode 158 as the second power semiconductor elements (lower arm circuit).

The power module 300 of this embodiment has a 2 in 1 structure where two arm circuits as the upper arm circuit and the lower arm circuit are integrally formed into a single module. Alternatively, the power module 300 may have a structure where a plurality of the upper arm circuits and the lower arm circuits are integrally formed into a single module. In this case, the power module 300 may have less output terminals and thus be reduced in size.

Figure 14:
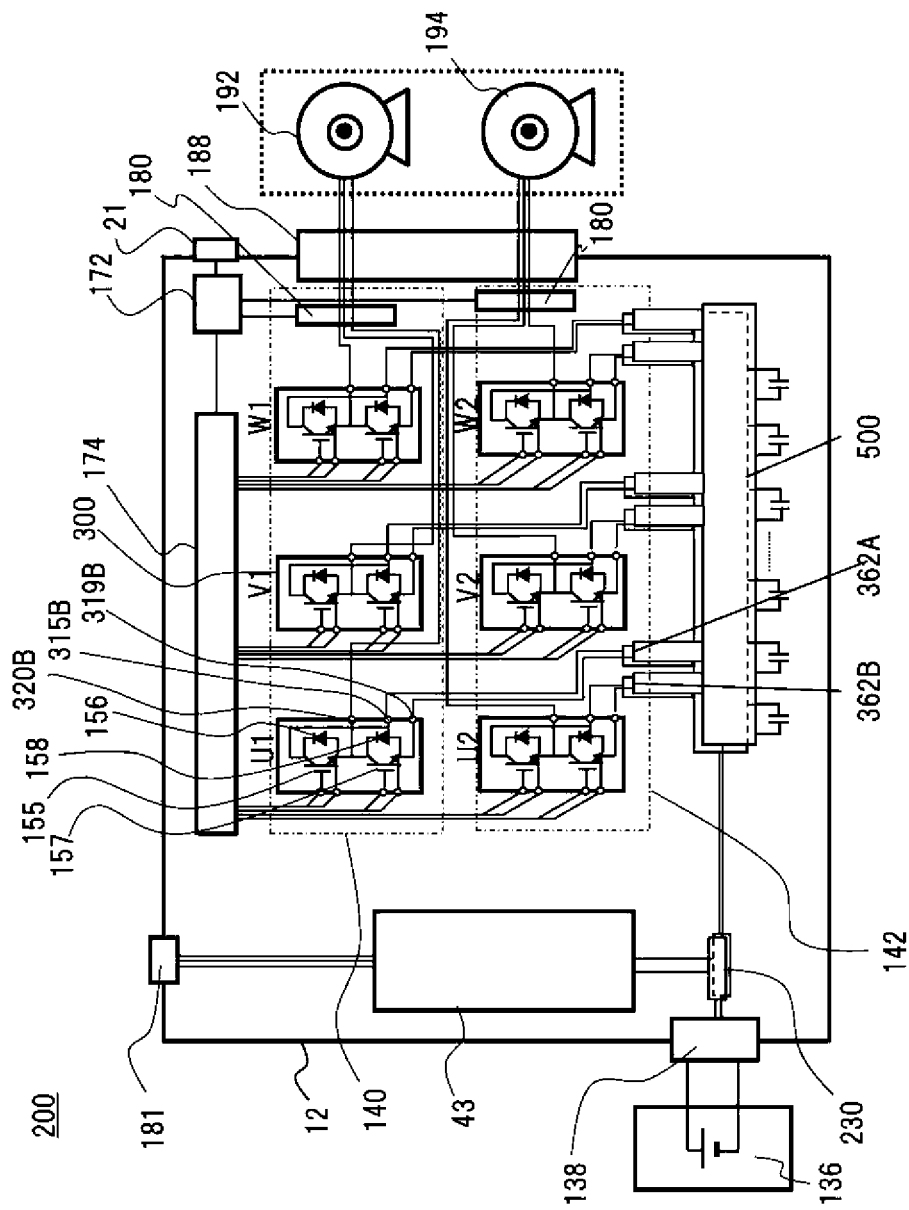
FIG. 14 is a circuit diagram of a power conversion device including the electric circuit body.

FIG. 14 is a circuit diagram of a power conversion device 200 including the electric circuit body 400.

The power conversion device 200 includes an inverter circuit 140, an inverter circuit 142, an auxiliary inverter circuit 43, and the capacitor module 500. Each of the inverter circuits 140 and 142 includes the electric circuit body 400 (not illustrated) that includes a plurality of the power modules 300, and connects the plurality of the power modules 300 to form a three-phase bridge circuit. When a current capacity is greater, the power modules 300 is further connected in parallel, which is applied to each phase of the three-phase inverter circuit; and as a result, the current capacity is increased. Alternatively, the upper arm circuit active element 155 and the lower arm circuit active element 157 may be respectively connected in parallel with the upper arm circuit diode 156 and the lower arm circuit diode 158, each of 155 to 158 built in the power module 300 as a power semiconductor element. As a result, the current capacity is increased.

The inverter circuit 140 and the inverter circuit 142 have the same basic circuit configuration, and basically have the same control method and operation. An outline of a circuit operation of the inverter circuit 140 or 142 is known, and thus a detailed description thereof will be omitted.

As has been described above, the upper arm circuit includes the upper arm circuit active element 155 and the upper arm circuit diode 156, each as a power semiconductor element for switching; and the lower arm circuit includes the lower arm circuit active element 157 and the lower arm circuit diode 158, each as a power semiconductor element for switching. The upper arm circuit active element 155 and the lower arm circuit active element 157 are configured to receive a drive signal outputted from one or the other of two driver circuits as a driver circuit 174, perform a switching operation, and convert DC power supplied from a battery 136 into three-phase AC power.

As has been described above, the upper arm circuit active element 155 and the lower arm circuit active element 157 respectively include the collector electrodes, the emitter electrodes and the gate electrodes. The upper arm circuit diode 156 and the lower arm circuit diode 158 respectively include two electrodes such as the cathode electrodes and the anode electrodes. As illustrated in FIG. 13, the cathode electrodes of the upper arm circuit diode 156 and the lower arm circuit diode 158 are respectively connected electrically to the collector electrodes of the upper arm circuit active element 155 and the lower arm circuit active element 157; and the anode electrodes of the upper arm circuit diode 156 and the lower arm circuit diode 158 are respectively connected electrically to the emitter electrodes of the upper arm circuit active element 155 and the lower arm circuit active element 157. With this configuration, the current flows from the emitter electrodes of the upper arm circuit active element 155 and the lower arm circuit active element 157 to the collector electrodes in a forward direction.

Here, a metal oxide semiconductor field effect transistor (MOSFET) may be used as an active element; and in this case, the upper arm circuit diode 156 and the lower arm circuit diode 158 are not required.

The positive electrode side terminal 315B and the negative electrode side terminal 319B in each of the upper arm series circuit and the lower arm series circuit are connected to DC terminals 362A and 362B, which are connected to the capacitors of the capacitor module 500. AC power is generated at a point where the upper arm circuit and the lower arm circuit are connected; and in each of the upper and lower arm series circuits, the point, at which the upper arm circuit and the lower arm circuit are connected, is connected to the AC side terminal 320B of the corresponding power module 300. The power module 300 at each phase has the AC side terminal 320B connected to an AC output terminal of the power conversion device 200, and the AC power generated is supplied to a stator winding of the motor generator 192 or a stator winding of the motor generator 194.

A control circuit 172 generates a timing signal to control a switching timing of the upper arm circuit active element 155 and the lower arm circuit active element 157, based on information inputted from a control device or a sensor (e.g., a current sensor 180) in a vehicle. The driver circuit 174 generates the drive signal for the switching operation of the upper arm circuit active element 155 and the lower arm circuit active element 157, based on the timing signal outputted from the control circuit 172.

Note that each of reference signs 181, 182, and 188 denotes a connector.

Each of the upper and lower arm series circuits includes a temperature sensor (not illustrated), and information regarding a temperature of the corresponding upper and lower arm series circuit is inputted to the control circuit 172. Further, information regarding voltage at DC positive electrode side of each of the upper and lower arm series circuits is inputted to the control circuit 172. Based on the information, the control circuit 172 detects over-temperature and over-voltage conditions. When the over-temperature condition or the over-voltage condition is detected, the control circuit 172 stops the switching operations of all of the upper arm circuit active elements 155 and the lower arm circuit active elements 157, so as to protect the upper and lower arm series circuits from the over-temperature condition or the over-voltage condition.

Figure 15:
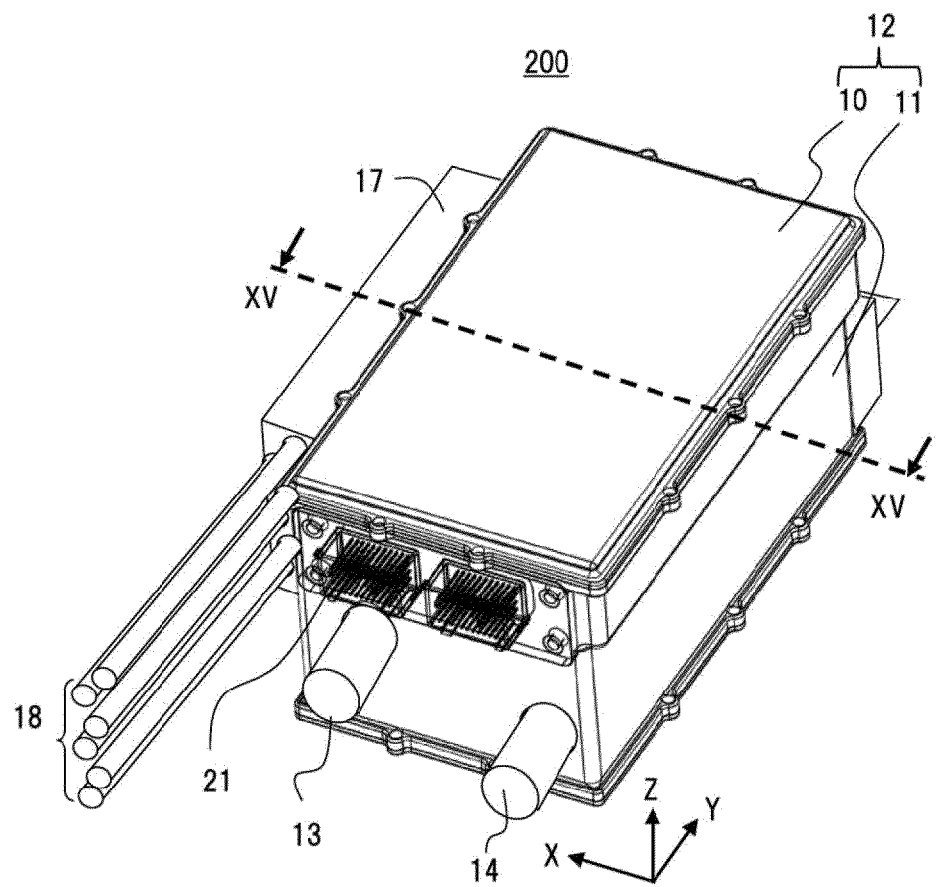
FIG. 15 is an external perspective view of the power conversion device.
Figure 16:
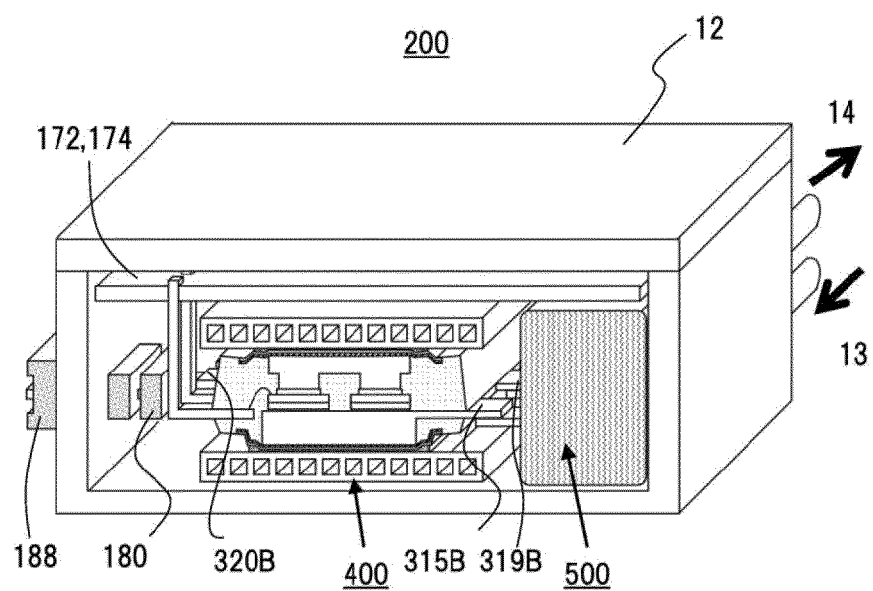
FIG. 16 is a cross-sectional perspective view of the power conversion device, taken along line XV-XV in FIG. 15.

FIG. 15 is an external perspective view of the power conversion device 200 of FIG. 14, and FIG. 16 is a cross-sectional perspective view of the power conversion device 200, taken along line XV-XV in FIG. 15.

As illustrated in FIG. 15, the power conversion device 200 includes a housing 12 having a substantially rectangular parallelepiped shape, and the housing 12 includes a lower case 11 and an upper case 10. The electric circuit body 400, the capacitor module 500, and others are accommodated in the housing 12. The electric circuit body 400 includes a cooling flow path; and a cooling inflow pipe 13 and a cooling outflow pipe 14, each communicating with the cooling flow path, protrude from one side surface of the housing 12. The lower case 11 has an opening at its upper side (in the Z-axis direction), and the upper case 10 is attached to the lower case 11 such that the opening of the lower case 11 is closed. The upper case 10 and the lower case 11 are formed of an aluminum alloy or others, and are externally sealed and fixed. The upper case 10 and the lower case 11 may be integrally formed. With the housing 12 formed in a simple rectangular parallelepiped shape, the power conversion device 200 is easily installed in a vehicle or others and is more effectively produced.

On one side surface of the housing 12 in a longitudinal direction, a connector 17 is attached, and the connector 17 has an AC terminal 18 connected thereto. Additionally, on a surface of the housing 12 where the cooling inflow pipe 13 and the cooling outflow pipe 14 are led out, a connector 21 is provided.

As illustrated in FIG. 16, the electric circuit body 400 is accommodated in the housing 12. The control circuit 172 and the driver circuit 174 are arranged above the electric circuit body 400, and the capacitor module 500 is accommodated at a side of DC terminals of the electric circuit body 400. The capacitor module 500 is arranged at the same height as the electric circuit body 400, so that the power conversion device 200 is made thinner and is thus fitted more flexibly in a vehicle. The AC side terminal 320B of the electric circuit body 400 penetrates through the current sensor 180 to be bonded to a bus bar. The positive electrode side terminal 315B and the negative electrode side terminal 319B as the DC terminals of the electric circuit body 400 are respectively bonded to a positive electrode terminal and a negative electrode terminal (as the DC terminals 362A and 362B in FIG. 13) of the capacitor module 500.

The configurations described in the foregoing embodiment are effective as follows:

(1) An electric circuit body 400 includes: a power semiconductor element 155; a first conductor plate 430 configured to be connected to one surface of the power semiconductor element 155; a first sheet-shaped member 440 having a first resin insulation layer 442 and configured to at least cover a surface of the first conductor plate 430; a sealing material 360 configured to seal each of the power semiconductor element 155, the first conductor plate 430, and an end of the first sheet-shaped member 440; and a first cooling member 340 configured to be adhesively attached to the first sheet-shaped member 440. In the electric circuit body 400, the first sheet-shaped member 440 includes: an embedded portion C where the end of the first sheet-shaped member 440 is covered with the sealing material 360; a heat dissipation surface A as a region to overlap the surface of the first conductor plate 430; and a margin B as a region between the embedded portion C and the heat dissipation surface A, the margin B is located more inward than the heat dissipation surface A, and the embedded portion C is located more inward than the margin B. With this configuration, even when the electric circuit body is warped, the cooling member is securely attached therein and the heat dissipation is thus not degraded.

(2) Provided is a method for manufacturing an electric circuit body 400, the method configured to seal, with a sealing material 360, a power semiconductor element 155, a first conductor plate 430 to be connected to one surface of the power semiconductor element 155, and a first sheet-shaped member 440 having a first resin insulation layer 442 and configured to at least cover a surface of the first conductor plate 430. The method includes: with the first sheet-shaped member 440 including an embedded portion C where an end of the first sheet-shaped member 440 is covered with the sealing material 360, a heat dissipation surface A as a region to overlap the surface of the first conductor plate 430, and a margin B as a region between the embedded portion C and the heat dissipation surface A, a first step of locating the embedded portion C more inward than the heat dissipation surface A and the margin B, and sealing with the sealing material 360; a second step of inducing a curing shrinkage of the sealing material 360 to locate the margin B more inward than the heat dissipation surface A; and a third step of attaching a cooling member 340 adhesively to the first sheet-shaped member 440. With this configuration, even when the electric circuit body is warped, the cooling member is securely attached therein and the heat dissipation is thus not degraded.

The present invention is not limited to the foregoing embodiment, and thus various modifications and changes appropriately made within the spirit of the present invention will naturally fall within the scope of claims of the present invention.

REFERENCE SIGNS LIST 10 upper case
11 lower case
13 cooling inflow pipe
14 cooling outflow pipe
17 connector
18 AC terminal
21 connector
43, 140, 142 inverter circuit
155 first power semiconductor element (upper arm circuit active element)
156 first power semiconductor element (upper arm circuit diode)
157 second power semiconductor element (lower arm circuit active element)
158 second power semiconductor element (lower arm circuit diode)
172 control circuit
174 driver circuit
180 current sensor
181, 182, 188 connector
192, 194 motor generator
200 power conversion device
300 power module
310 circuit body
315B positive electrode side terminal
319B negative electrode side terminal
320B AC side terminal
325K Kelvin emitter signal terminal
325L lower arm gate signal terminal
325M mirror emitter signal terminal
325U upper arm gate signal terminal
340 cooling member
360 sealing material
400 electric circuit body
430 first conductor plate (at emitter side of upper arm circuit)
431 second conductor plate (at collector side of upper arm circuit)
432 third conductor plate (at emitter side of lower arm circuit)
433 fourth conductor plate (at collector side of lower arm circuit)
440 first sheet-shaped member (at emitter side)
441 second sheet-shaped member (at collector side)
442 first resin insulation layer (at emitter side)
443 second resin insulation layer (at collector side)
444 metal foil
453 heat conductor member
500 capacitor module
601 transfer molding device
602 spring
A heat dissipation surface
B margin
C embedded portion

The invention claimed is:

1. An electric circuit body comprising:
a power semiconductor element;
a first conductor plate configured to be connected to one surface of the power semiconductor element;
a first sheet-shaped member having a first resin insulation layer and covering at least a surface of the first conductor plate;
a sealing material configured to seal end portions of the power semiconductor element, the first conductor plate, and the first sheet-shaped member; and
a first cooling member configured to be adhesively attached to the first sheet-shaped member,
wherein the first sheet-shaped member includes:
an embedded portion including the end of the first sheet-shaped member covered with the sealing material;
a heat dissipation surface portion overlapping with the first conductor plate and including a first exposed surface that is exposed outside the sealing material; and
a margin portion between the embedded portion and the heat dissipation surface portion, the margin portion including a second exposed surface that is exposed outside the sealing material, wherein:
the second exposed surface is located more outwardly than a top surface of the sealing material, and the first exposed surface is located more outwardly than the top surface of the sealing material and the second exposed surface, the margin portion is located more inward than the heat dissipation surface portion, and the embedded portion is located more inward than the margin portion.

2. The electric circuit body according to claim 1, further comprising:
a second conductor plate to be connected to another surface of the power semiconductor element; and
a second sheet-shaped member having a second resin insulation layer and covering at least a surface of the second conductor plate; and
a second cooling member configured to be adhesively attached to the second sheet-shaped member,
wherein the sealing material seals each of the second conductor plate and an end of the second sheet-shaped member, the second sheet-shaped member includes:
an embedded portion including the end of the second sheet-shaped member covered with the sealing material;
a heat dissipation surface portion overlapping with the second conductor plate and including a third exposed surface that is exposed outside the sealing material; and
a margin portion between the embedded portion and the heat dissipation surface portion, the margin portion including a third exposed surface that is exposed outside the sealing material, wherein
the margin portion is located more inward than the heat dissipation surface portion, and
the embedded portion is located more inward than the margin portion.

3. The electric circuit body according to claim 2, wherein
the second sheet-shaped member includes the second resin insulation layer and a second metal foil, each layered on the other, and
the second cooling member is adhesively attached to the heat dissipation surface portion of the second sheet-shaped member with the second metal foil interposed between the second cooling member and the heat dissipation surface portion of the second sheet-shaped member.

4. The electric circuit body according to claim 2, wherein the second cooling member is adhesively attached to the second sheet-shaped member with a heat conductor member interposed between the second cooling member and the second sheet-shaped member.

5. The electric circuit body according to claim 2, wherein the sealing material has a greater amount of shrinkage with respect to a temperature than the second conductor plate.

6. The electric circuit body according to claim 1, wherein the first sheet-shaped member includes the first resin insulation layer and a first metal foil, each layered on the other, and the first cooling member is adhesively attached to the heat dissipation surface portion of the first sheet-shaped member with the first metal foil interposed between the first cooling member and the heat dissipation surface portion of the first sheet-shaped member.

7. The electric circuit body according to claim 1, wherein the first cooling member is adhesively attached to the first sheet-shaped member with a heat conductor member interposed between the first cooling member and the first sheet-shaped member.

8. The electric circuit body according to claim 1, wherein the sealing material has a greater amount of shrinkage with respect to a temperature than the first conductor plate.

9. The electric circuit body according to claim 1, further comprising:
a first terminal led out of the power semiconductor element and connected to a capacitor; and
a second terminal led out of the power semiconductor element at a side opposite to a side at which the first terminal is led out, and connected to a motor.

10. A power conversion device comprising the electric circuit body according to claim 1,
the power conversion device configured to convert direct current power to alternating current power.

11. A method for manufacturing an electric circuit body, the method configured to seal, with a sealing material, a power semiconductor element, a first conductor plate to be connected to one surface of the power semiconductor element, and a first sheet-shaped member having a first resin insulation layer and covering at least a surface of the first conductor plate, the method comprising:
with the first sheet-shaped member including an embedded portion including an end of the first sheet-shaped member covered with the sealing material, a heat dissipation surface portion overlapping with the first conductor plate, and a margin portion between the embedded portion and the heat dissipation surface portion,
a first step of locating the embedded portion more inward than the heat dissipation surface portion and the margin portion, and sealing with the sealing material;
a second step of inducing a curing shrinkage of the sealing material to locate the margin portion more inward than the heat dissipation surface portion and more outwardly than a top surface of the sealing material and to locate the heat dissipation surface portion more outwardly than the top surface of the sealing material and the margin portion; and
a third step of attaching a cooling member adhesively to the first sheet-shaped member.

12. The method for manufacturing an electric circuit body according to claim 11, wherein the third step includes attaching the cooling member adhesively to the first sheet-shaped member with a heat conductor member interposed between the cooling member and the first sheet-shaped member.

* * * * *